United States Patent
Kodani et al.

(10) Patent No.: US 9,128,547 B2
(45) Date of Patent: Sep. 8, 2015

(54) TRANSPARENT PIEZOELECTRIC SHEET, AND TRANSPARENT PIEZOELECTRIC SHEET-WITH-A-FRAME, TOUCH PANEL, AND ELECTRONIC DEVICE EACH HAVING THE TRANSPARENT PIEZOELECTRIC SHEET

(75) Inventors: Tetsuhiro Kodani, Settsu (JP); Yuuki Kuwajima, Settsu (JP); Eri Mukai, Settsu (JP); Takashi Kanemura, Settsu (JP); Meiten Koh, Settsu (JP); Kenji Omote, Sendai (JP); Hiroji Ohigashi, Sendai (JP)

(73) Assignees: Daikin Industries, Ltd., Osaka (JP); Ideal Star Inc., Miyagi (JP)

( * ) Notice: Subject to any disclaimer, the term of this patent is extended or adjusted under 35 U.S.C. 154(b) by 428 days.

(21) Appl. No.: 13/639,830

(22) PCT Filed: Feb. 28, 2011

(86) PCT No.: PCT/JP2011/054520
§ 371 (c)(1),
(2), (4) Date: Oct. 5, 2012

(87) PCT Pub. No.: WO2011/125388
PCT Pub. Date: Oct. 13, 2011

(65) Prior Publication Data
US 2013/0027340 A1  Jan. 31, 2013

(30) Foreign Application Priority Data
Apr. 7, 2010  (JP) ................................. 2010-089064

(51) Int. Cl.
*H01L 41/047* (2006.01)
*G01L 7/08* (2006.01)
(Continued)

(52) U.S. Cl.
CPC ...... *G06F 3/041* (2013.01); *G06F 2203/04105* (2013.01)

(58) Field of Classification Search
USPC ............ 310/324, 363–366; 73/715, 721, 723; 345/173
See application file for complete search history.

(56) References Cited

U.S. PATENT DOCUMENTS

| 8,405,618 B2 * | 3/2013 | Colgate et al. ................. 345/173 |
| 2006/0132000 A1 | 6/2006 | Katsuki et al. |

(Continued)

FOREIGN PATENT DOCUMENTS

| CN | 100466318 C | 3/2009 |
| JP | 5-61592 A | 3/1993 |

(Continued)

OTHER PUBLICATIONS

International Search Report of corresponding PCT Application No. PCT/JP2011/054520.

(Continued)

*Primary Examiner* — Thomas Dougherty
(74) *Attorney, Agent, or Firm* — Global IP Counselors

(57) ABSTRACT

A transparent piezoelectric sheet includes a quadrilateral-shaped transparent piezoelectric film and a first transparent plate electrode. The quadrilateral-shaped transparent piezoelectric film includes an organic polymer. The quadrilateral-shaped transparent piezoelectric film has entire main surfaces that are piezoelectric. The first transparent plate electrode is layered on part of a first main surface of the main surfaces of the transparent piezoelectric film. One to three sides of the four sides of the quadrilateral shape of the transparent piezoelectric film and area(s) of the first main surface adjacent thereto are not covered by the first transparent plate electrode.

17 Claims, 8 Drawing Sheets

(51) Int. Cl.
*G01L 9/06* (2006.01)
*G06F 3/041* (2006.01)

(56) References Cited

U.S. PATENT DOCUMENTS

| | | |
|---|---|---|
| 2006/0144154 A1 | 7/2006 | Ueno et al. |
| 2009/0085443 A1 | 4/2009 | Hishinuma et al. |
| 2009/0167704 A1* | 7/2009 | Terlizzi et al. ................ 345/173 |
| 2010/0026657 A1* | 2/2010 | Gettemy et al. .............. 345/174 |
| 2010/0123685 A1* | 5/2010 | Lee et al. ...................... 345/177 |
| 2011/0043477 A1* | 2/2011 | Park et al. ..................... 345/174 |
| 2013/0027339 A1* | 1/2013 | Kodani et al. ................ 345/173 |

FOREIGN PATENT DOCUMENTS

| | | |
|---|---|---|
| JP | 7-334308 A | 12/1995 |
| JP | 2004-125571 A | 4/2004 |
| JP | 2004-534974 A | 11/2004 |
| JP | 2006-163619 A | 6/2006 |
| JP | 2010-26938 A | 2/2010 |
| TW | 201003496 A | 1/2010 |
| WO | 2009/150498 A2 | 12/2009 |

OTHER PUBLICATIONS

International Preliminary Report of corresponding PCT Application No. PCT/JP2011/054520.

* cited by examiner

TRANSPARENT PIEZOELECTRIC SHEET, AND TRANSPARENT PIEZOELECTRIC SHEET-WITH-A-FRAME, TOUCH PANEL, AND ELECTRONIC DEVICE EACH HAVING THE TRANSPARENT PIEZOELECTRIC SHEET

CROSS-REFERENCE TO RELATED APPLICATIONS

This U.S. National stage application claims priority under 35 U.S.C. §119(a) to Japanese Patent Application No. 2010-089064, filed in Japan on Apr. 7, 2010, the entire contents of which are hereby incorporated herein by reference.

TECHNICAL FIELD

The present invention relates to a transparent piezoelectric sheet, and a transparent piezoelectric sheet-with-a-frame, a touch panel, and an electronic device each having the transparent piezoelectric sheet.

BACKGROUND ART

In recent years, display and input devices having touch panels, which are input devices, installed on the front surfaces of display devices such as liquid crystal displays have been put into practical use and are being used in operation panels of portable devices, such as mobile telephones, and home appliances. Display and input devices using touch panels enable the user to intuitively operate the device by pressing the display on the screen.

Touch panels that have been put into practical use so far have only been able to detect the position the user has pressed (in the present specification, this will sometimes be called "touch position") and have not been able to detect the force with which the user has pressed the touch panel (that is, the height (force) of the pressing; in the present specification, this will sometimes be called "touch pressure"). In display and input devices using touch panels, the touch panel is installed on the front surface of the display device, so it is required that the transparency of the touch panel be high in order to raise the visibility of the display of the display device.

As an input device or something similar that is capable of detecting the force of the pressing and is transparent, for example, Japanese Patent Unexamined Publication No. 2006-163619 discloses a touch panel portion that is used as a member of electronic paper and comprises a piezoelectric, a first electrode disposed on one side of the piezoelectric, and a second electrode disposed on the other side of the piezoelectric.

Further, Japanese Patent Unexamined Publication No. 2004-534974 discloses a touchscreen system comprising: a first sensor system coupled to a touchscreen, said first sensor system determining a set of position coordinates for each touch of said touchscreen; and a second sensor system coupled to said touchscreen, said second sensor system confirming each touch of said touchscreen by a first type of object, and invalidating each touch of said touchscreen by a second type of object, wherein said second sensor system is incapable of determining said set of position coordinates. And as the first sensor system, specifically force sensors placed outside the viewing area of an LCD are disclosed.

Further Japanese Patent Unexamined Publication No. 2004-125571 discloses a transparent piezoelectric sensor in which a transparent pressure-sensitive layer that is piezoelectric and a pair of transparent conductive film layers that are placed opposing each other via the transparent pressure-sensitive layer are formed on a pair of transparent substrates that oppose each other.

SUMMARY

Technical Problem

According to the research of the present inventors, in a transparent piezoelectric sheet for touch pressure detection, from the standpoint of widening the effective area of touch pressure detection it is preferred that entire main surfaces of a transparent piezoelectric film used in this be piezoelectric, and from the standpoint of raising the precision of touch pressure detection it is preferred that as wide an area as possible of two main surfaces of the transparent piezoelectric film be covered by a pair of transparent plate electrodes. Because of this, touch pressure detection in a wider area on the transparent piezoelectric sheet and with higher precision becomes possible.

Such a transparent piezoelectric sheet for touch pressure detection is preferably used in combination with a touch panel for touch position detection. At this time, it is preferred that the size of the transparent piezoelectric sheet for touch pressure detection as seen in a plan view not exceed the size of the touch panel for touch position detection, and it is desired that the transparent piezoelectric sheet for touch pressure detection be able to detect touch pressure in all of the detection-effective region of the touch panel for touch position detection. It is generally known that it is always required that the proportion of the area of the detection-effective region in the area of the touch panel for touch position detection be high, but in order to be able to detect touch pressure in all of the detection-effective region of the touch panel for touch position detection, inevitably an even stricter requirement than that of the touch panel for touch position detection becomes imposed on the transparent piezoelectric sheet for touch pressure detection.

This requirement can be met provided that touch pressure detection is possible in the entire surface of the transparent piezoelectric sheet for touch pressure detection. In order to make this possible, it suffices for the entire surfaces of the two main surfaces of the transparent piezoelectric sheet for touch pressure detection to be covered by transparent plate electrodes.

However, it is preferred that the peripheral portion of the transparent piezoelectric sheet for touch pressure detection be covered by a frame from the standpoint of handling ease and so forth.

In this case, if touch pressure detection is possible in the entire surface of the transparent piezoelectric sheet for touch pressure detection, the transparent piezoelectric sheet ends up detecting the pressure applied by the frame, and this renders impossible the detection of touch pressure that is the original purpose of the transparent piezoelectric sheet or else remarkably lowers the precision of the detection.

Further, there is also a case where the transparent piezoelectric sheet for touch pressure detection is not stored in a frame but is placed as is inside a casing having an open portion and used as a member of an electronic device. In this case also, if the inner edge portion of the casing that defines the open portion is in contact with the transparent piezoelectric sheet for touch pressure detection, like in the case of the frame the transparent piezoelectric sheet ends up detecting the pressure applied by the inner edge portion, and this renders impossible the detection of touch pressure that is the original purpose of the transparent piezoelectric sheet or else remarkably lowers the precision of the detection.

As a solution to this, it is conceivable to layer transparent plate electrodes only on the sections of the transparent piezoelectric film not covered by the frame. However, among the strict requirements as described above, in order to layer transparent plate electrodes only on the sections of both surface of the transparent piezoelectric film not covered by the frame, exact alignment is required and continuous production is difficult, which remarkably raises the product cost.

None of the publicly known touch panels and piezoelectric sensors described above have this problem because they are not intended to be used in combination with a touch panel for touch position detection.

It is an object of the present invention to provide a transparent piezoelectric sheet that is capable of detecting touch pressure in a wider effective area and with higher precision and has a low manufacturing cost.

Solution to Problem

Therefore, the present inventors discovered, as a result of intensive studies, that by giving a transparent piezoelectric sheet a configuration comprising a quadrilateral-shaped transparent piezoelectric film that includes an organic polymer and whose entire main surfaces are piezoelectric and a first transparent plate electrode that is layered on part of a first main surface of the transparent piezoelectric film, with one to three sides of the four sides of the quadrilateral shape of the transparent piezoelectric film and the first main surface in the neighborhood(s) thereof not being covered by the first transparent plate electrode, a high precision of touch pressure detection, a wide effective area, and a low manufacturing cost can all be simultaneously achieved and, as a result of further studies, arrived at completing the present invention.

A transparent piezoelectric sheet pertaining to a first aspect of the present invention comprises: a quadrilateral-shaped transparent piezoelectric film that includes an organic polymer and whose entire main surfaces are piezoelectric; and a first transparent plate electrode that is layered on part of a first main surface of the transparent piezoelectric film, wherein one to three sides of the four sides of the quadrilateral shape of the transparent piezoelectric film and the first main surface in the neighborhood(s) thereof are not covered by the first transparent plate electrode.

Although it is not a requirement of the transparent piezoelectric sheet of the first aspect, when using the transparent piezoelectric sheet, a second transparent plate electrode is layered or placed on a second main surface of the transparent piezoelectric film. In a case where the region in which the first transparent plate electrode and the second transparent plate electrode oppose each other has been pressed, the touch pressure thereof is transmitted to an outside detection circuit as an electrical signal (a voltage signal).

According to the configuration of the transparent piezoelectric sheet pertaining to the first aspect of the present invention, the section of the second main surface corresponding to the section of the first main surface not covered by the first transparent plate electrode is covered by the second transparent plate electrode, and even if this section is further covered by a frame, the pressure resulting from the frame in this covered section does not travel to the detection circuit as an electrical signal and so it does not hinder the detection of the touch pressure.

Likewise, even if the section of the first main surface covered by the first transparent plate electrode is further covered by a frame, as long as the section of the second main surface corresponding to this covered section is not covered by the second transparent plate electrode, the pressure resulting from the frame in this covered section does not travel to the detection circuit as an electrical signal and so it does not hinder the detection of the touch pressure.

Because of this, as long as the position where the transparent plate electrode is layered or placed is accurately controlled in regard to only either one of the first main surface or the second main surface, the effective area of touch pressure detection can be easily enlarged to an area that is substantially the same as that of the open portion of the frame (e.g., equal to or greater than 70% and less than 100% of the area of the open portion, more preferably equal to or greater than 90% and less than 100%, and even more preferably equal to or greater than 95% and less than 100%).

Further, because the transparent piezoelectric film includes the organic polymer, the manufacturing cost of the transparent piezoelectric sheet pertaining to the first aspect of the present invention can be lowered because manufacture in a large area such as roll-to-roll becomes possible. Further, because the transparent piezoelectric film includes the organic polymer, the transparent piezoelectric sheet is flexible. Because of this, it becomes possible to bend the transparent piezoelectric sheet when, for example, adhering the transparent piezoelectric sheet to a touch panel for touch position detection, and the adhering can be performed easily and accurately.

Further, one to three sides of the four sides of the quadrilateral shape of the transparent piezoelectric film and the first main surface in the neighborhood(s) thereof are not covered by the first transparent plate electrode. The second transparent plate electrode can exist on the section of the second main surface corresponding to the side(s) and the neighborhood(s) thereof not covered by the first transparent plate electrode. Here, "one to three sides of the four sides of the quadrilateral shape of the transparent piezoelectric film and the first main surface in the neighborhood(s) thereof are not covered by the first transparent plate electrode" becomes the same as one to three sides of the four sides and the neighborhood(s) thereof being covered by the second transparent plate electrode. This facilitates roll-to-roll production of the transparent piezoelectric sheet of the present invention and contributes to reducing the manufacturing cost. This will be described more specifically in the embodiments of the invention.

The transparent piezoelectric sheet pertaining to the first aspect of the present invention further transmits light, so when it is adhered to a touch position detection-use touch panel or the like, the touch position detection-use touch panel or the like can be seen through the transparent piezoelectric sheet. Because of this, easy and accurate alignment becomes possible.

These are the same also in the case of placing and using the transparent piezoelectric sheet of the first aspect inside the casing of an electronic device as described above.

A transparent piezoelectric sheet pertaining to a second aspect of the present invention is the transparent piezoelectric sheet pertaining to the first aspect, which comprises the quadrilateral-shaped transparent piezoelectric film that includes the organic polymer and whose entire main surfaces are piezoelectric and the first transparent plate electrode that is layered on part of the first main surface of the transparent piezoelectric film, wherein the transparent piezoelectric sheet is installed and used on the upper surface of a device having a second transparent plate electrode installed on all or part of its upper surface in such a way that, as seen in a plan view, the outline of the first transparent plate electrode and the outline of the second transparent plate electrode intersect each other and, as seen in a plan view, a region of overlap between the first transparent plate electrode and the second transparent plate electrode does not exist on the four sides of the quadrilateral shape of the transparent piezoelectric film and the neighborhoods thereof.

The transparent piezoelectric sheet is installed and used on the upper surface of the device on which the second transparent plate electrode is installed.

The transparent piezoelectric sheet pertaining to the second aspect of the present invention has the same effects as those of the transparent piezoelectric sheet pertaining to the first aspect. In particular, in the transparent piezoelectric sheet pertaining to the second aspect of the present invention, as long as the position is accurately controlled in regard to only either one of the layering of the first transparent plate electrode on the first main surface and the layering of the second transparent plate electrode on the second main surface, the effective area of touch pressure detection can be easily enlarged to an area that is substantially the same as that of the open portion of the frame (e.g., equal to or greater than 70% and less than 100% of the area of the open portion, more preferably equal to or greater than 90% and less than 100%, and even more preferably equal to or greater than 95% and less than 100%).

Here, examples of controlling the layering of the second transparent plate electrode on the second main surface include controlling the layering of the second transparent plate electrode on the upper surface of the device and controlling the layering of the transparent piezoelectric sheet pertaining to the second aspect of the present invention on the device upper surface.

In particular, when placing the transparent piezoelectric sheet pertaining to the second aspect of the present invention on the device upper surface, the device upper surface can be seen through the transparent piezoelectric sheet because the transparent piezoelectric sheet pertaining to the second aspect of the present invention transmits light. Because of this, easy and accurate alignment becomes possible.

A transparent piezoelectric sheet pertaining to a third aspect of the present invention is the transparent piezoelectric sheet pertaining to the first aspect and further comprises a third transparent plate electrode that is layered on part of a second main surface of the transparent piezoelectric film, wherein one to three sides of the four sides of the quadrilateral shape of the transparent piezoelectric film and the second main surface in the neighborhood(s) thereof are not covered by the third transparent plate electrode, as seen in a plan view the outline of the first transparent plate electrode and the outline of the third transparent plate electrode intersect each other, and as seen in a plan view a region of overlap between the first transparent plate electrode and the third transparent plate electrode does not exist on the four sides of the quadrilateral shape of the transparent piezoelectric film and the neighborhoods thereof.

The transparent piezoelectric sheet pertaining to the third aspect of the present invention has the same effects as those of the transparent piezoelectric sheet pertaining to the first aspect. In particular, in the transparent piezoelectric sheet pertaining to the third aspect of the present invention, as long as the position is accurately controlled in regard to only either one of the layering of the first transparent plate electrode on the first main surface and the layering of the second transparent plate electrode on the second main surface, the effective area of touch pressure detection can be easily enlarged to an area that is substantially the same as that of the open portion of the frame (e.g., equal to or greater than 70% and less than 100% of the area of the open portion, more preferably equal to or greater than 90% and less than 100%, and even more preferably equal to or greater than 95% and less than 100%).

A transparent piezoelectric sheet pertaining to a fourth aspect of the present invention is the transparent piezoelectric sheet pertaining to any of the first to third aspects, wherein the thickness of the transparent piezoelectric film is 1 µm to 200 µm.

Because of this, the function of detecting touch pressure with high sensitivity and high precision can be imparted without impairing the sensitivity and precision of the detection of the touch position by the touch position detection-use touch panel. The thickness is preferably equal to or less than 50 µm from the standpoint of transparency, and the thickness is preferably 20 µm to 100 µm from the standpoint of touch pressure detection sensitivity.

A transparent piezoelectric sheet pertaining to a fifth aspect of the present invention is the transparent piezoelectric sheet pertaining to the first aspect, wherein the organic polymer is an organic polymer selected from vinylidene fluoride-tetrafluoroethylene copolymer, vinylidene fluoride-trifluoroethylene copolymer, and polyvinylidene fluoride.

A transparent piezoelectric sheet pertaining to a sixth aspect of the present invention is the transparent piezoelectric sheet pertaining to any of the first to fifth aspects, wherein the side and the neighborhood thereof is a region within 1 mm to 30 mm from that side.

Because of this, use of a frame becomes possible, and the effective area of touch pressure detection can be enlarged to an area that is substantially the same as that of the open portion of the frame (e.g., equal to or greater than 70% and less than 100% of the area of the open portion, more preferably equal to or greater than 90% and less than 100%, and even more preferably equal to or greater than 95% and less than 100%).

A transparent piezoelectric sheet pertaining to a seventh aspect of the present invention is any of the transparent piezoelectric sheets pertaining to the first to sixth aspects, wherein the area of the region of overlap between the first transparent plate electrode and the second transparent plate electrode or the third transparent plate electrode is equal to or greater than 70% with respect to the area of the main surfaces of the transparent piezoelectric film.

Because of this, the effective area of touch pressure detection can be enlarged to an area that is substantially the same as that of the open portion of the frame (e.g., equal to or greater than 70% and less than 100% of the area of the open portion, more preferably equal to or greater than 90% and less than 100%, and even more preferably equal to or greater than 95% and less than 100%).

A transparent piezoelectric sheet pertaining to an eighth aspect of the present invention is the transparent piezoelectric sheet pertaining to any of the first to seventh aspects, wherein the transparent piezoelectric sheet is for touch pressure detection.

A transparent piezoelectric sheet pertaining to a ninth aspect of the present invention is the transparent piezoelectric sheet pertaining to any of the first to eighth aspects, wherein the transparent piezoelectric sheet is used in combination with a touch position detection-use touch panel.

The transparent piezoelectric sheet can detect touch pressure, so because of this, the function of detecting touch pressure can be imparted to the touch position detection-use touch panel.

The touch position detection-use touch panel is ordinarily placed on either the surface on the touch side of the transparent piezoelectric sheet or the surface on the opposite side of the touch side.

At this time, the electrode on the touch position detection-use touch panel side of the transparent piezoelectric sheet is ordinarily placed in such a way that it does not electrically contact the electrode of the touch position detection-use touch panel. Specifically, for example, a transparent insulating layer is placed between these electrodes in such a way as to be adjacent to them. The insulating layer is preferably flexible. The insulating layer may be an insulating adhesive layer that adheres together the transparent piezoelectric sheet and the touch position detection-use touch panel. Further, for example, a touch position detection-use touch panel having an insulating layer on its surface may be used. Other insulating layers used in the present invention may also be insulating adhesive layers.

However, in a case where the electrode on the touch position detection-use touch panel side of the transparent piezoelectric sheet is a ground electrode and the electrode on the transparent piezoelectric sheet side of the touch position detection-use touch panel is also a ground electrode, these two electrodes may contact each other.

A transparent piezoelectric sheet pertaining to a tenth aspect of the present invention is the transparent piezoelectric sheet pertaining to any of the first to ninth aspects, wherein the touch position detection-use touch panel is a resistive touch panel or a capacitive touch panel.

The transparent piezoelectric sheet can, without impairing the advantageous characteristic of a resistive touch position detection-use touch panel that it has a low manufacturing cost or the advantageous characteristic of a capacitive touch position detection-use touch panel that multipoint detection is easy, impart the function of detecting touch pressure to these touch panels.

A transparent piezoelectric sheet-with-a-frame pertaining to an eleventh aspect of the present invention comprises: the transparent piezoelectric sheet pertaining to any of the first to tenth aspects; and a frame that covers a peripheral edge portion of the transparent piezoelectric film and does not coincide with the region of overlap as seen in a plan view.

Because of this, handling becomes easy and touch pressure detection is not hindered by the pressure applied by the frame.

A transparent piezoelectric sheet-with-a-frame pertaining to a twelfth aspect of the present invention is the transparent piezoelectric sheet-with-a-frame pertaining to the eleventh aspect and further comprises a pressure-sensitive adhesive portion disposed on its surface.

Because of this, the transparent piezoelectric sheet-with-a-frame can be adhered to and used with an arbitrary object such as a touch position detection-use touch panel, and the function of detecting touch pressure can be imparted to the surface of that object.

Here, the pressure-sensitive adhesive portion can be disposed on the frame surface, for example.

Further, it is preferred that the pressure-sensitive adhesive portion be disposed in a position that is not visible to the user at the time of use.

A touch position detection-use touch panel pertaining to a thirteenth aspect of the present invention has the transparent piezoelectric sheet-with-a-frame pertaining to the twelfth aspect adhered to it by the pressure-sensitive adhesive portion.

A display device pertaining to a fourteenth aspect of the present invention has the transparent piezoelectric sheet-with-a-frame pertaining to the twelfth aspect adhered to it by the pressure-sensitive adhesive portion.

A touch panel pertaining to a fifteenth aspect of the present invention comprises: the transparent piezoelectric sheet pertaining to any of the first to tenth aspects; a touch position detection-use touch panel that is placed on one surface of the transparent piezoelectric sheet; and a frame that covers a peripheral edge portion of the transparent piezoelectric sheet and a peripheral edge portion of the touch position detection-use touch panel.

The touch panel can detect both the pressure and the position of a touch and further has effects resulting from the effects of each of the transparent piezoelectric sheets of the first to tenth aspects of the present invention.

An electronic device pertaining to a sixteenth aspect of the present invention comprises: the transparent piezoelectric sheet pertaining to any of the first to tenth aspects; and a casing inside of which the transparent piezoelectric sheet is placed, wherein the casing has an open portion, an inner edge portion that defines the open portion covers in a frame-like manner and is in contact with the transparent piezoelectric sheet, and as seen in a plan view the region of that contact does not coincide with the region of overlap.

The electronic device has effects resulting from the effects of each of the transparent piezoelectric sheets of the first to tenth aspects of the present invention. In particular, the electronic device can detect touch pressure, which is its original purpose, and be operated on the basis thereof without being affected by the pressure applied to the transparent piezoelectric sheet by the inner edge portion of the casing.

An electronic device pertaining to a seventeenth aspect of the present invention is the electronic device pertaining to the sixteenth aspect and further comprises a touch position detection-use touch panel that is placed in contact with the surface on the opposite side of the touch side of the transparent piezoelectric sheet.

An electronic device pertaining to an eighteenth aspect of the present invention is the electronic device pertaining to the sixteenth or seventeenth aspect, wherein of the first transparent plate electrode and the second transparent plate electrode, the transparent plate electrode on the opposite side of the touch side is a ground electrode.

Because of this, the noise of the output voltage can be mitigated.

A electronic device pertaining to a nineteenth aspect of the present invention is the electronic device pertaining to the eighteenth aspect, wherein the transparent plate electrode on the opposite side of the touch side doubles as a ground electrode of a touch position detection-use touch panel.

Because of this, the structure of the touch panel can be simplified and the manufacturing cost can be lowered.

Advantageous Effects of Invention

The transparent piezoelectric sheet and the touch panel of the present invention are capable of detecting touch pressure in a wider effective area and with higher precision and have a low manufacturing cost.

DESCRIPTION OF EMBODIMENTS

Figure 1A:
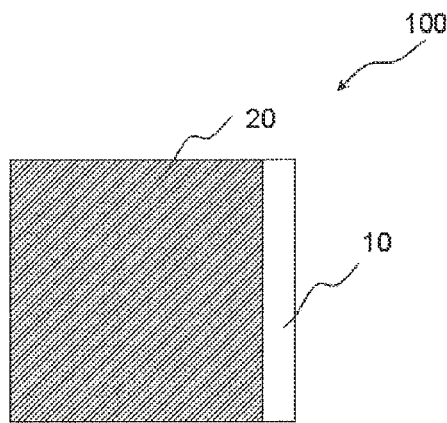
FIG. 1 is a plan view showing the configuration of an aspect of a transparent piezoelectric sheet of the present invention.
Figure 1B:
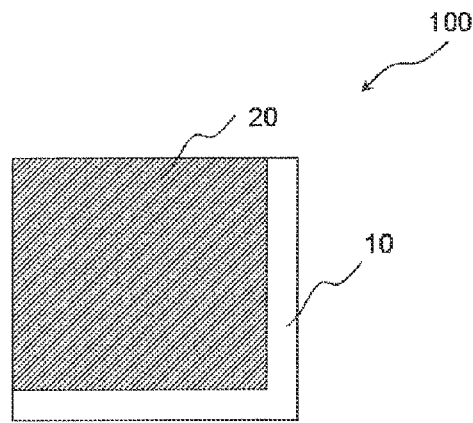
Figure 1C:
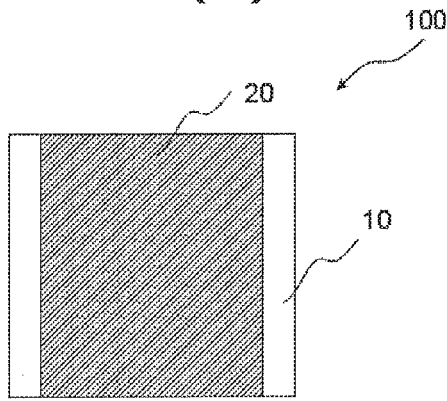
Figure 1D:
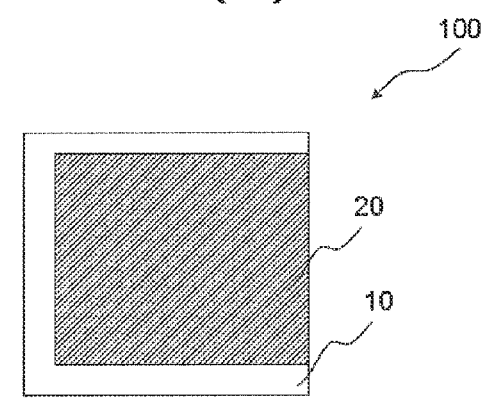

Embodiments of the present invention will be described below with reference to the drawings, but the present invention is not limited thereto. In order to give priority to facilitating understanding, these drawings do not accurately depict ratios between dimensions. Further, it is not the case that the configural requirements described below are all configural requirements essential to the present invention. Portions having the same reference signs in the drawings below express the same meanings Throughout the present specification, "side and the neighborhood thereof" is preferably a region within 1 mm to 30 mm from a side as long as there are no particular statements otherwise.

Through the present specification, the term "copolymer" is used with the intention of including random copolymers, block copolymers, and graft copolymers and the like as long as there are no particular limitations otherwise.

Throughout the present specification, the term "transparent" means light-transmissive and more specifically that total tight transmittance as measured by a method in accordance with the method described in ASTM D1003 is equal to or greater than 40%.

<First Embodiment (Transparent Piezoelectric Sheet)>

First, the configuration of a transparent piezoelectric s of the present embodiment will be described.

A transparent piezoelectric sheet 100 comprises: a quadrilateral-shaped transparent piezoelectric film 10 that includes an organic polymer and whose entire main surfaces are piezoelectric; and a first transparent plate electrode 20 that is layered on part of a first main surface of the transparent piezoelectric film, wherein one to three sides of the four sides of the quadrilateral shape of the transparent piezoelectric film 10 and the first main surface in the neighborhood(s) thereof are not covered by the first transparent plate electrode 20.

The transparent piezoelectric sheet will be described with reference to FIG. 1.

As shown in FIG. 1, the transparent piezoelectric sheet 100 is configured from the transparent piezoelectric film 10 and the first transparent plate electrode 20.

The transparent piezoelectric film 10 has a quadrilateral shape, includes an organic polymer, and its entire main surfaces are piezoelectric, and the first transparent plate electrode 20 is layered not on all but part of the first main surface of the transparent piezoelectric film 10.

Here, one to three sides of the four sides of the quadrilateral shape of the transparent piezoelectric film 10 and the first main surface in the neighborhood(s) thereof are not covered by the first transparent plate electrode 20.

FIGS. 1(a) to 1(d) show examples of specific aspects thereof. In the transparent piezoelectric film 10 of FIG. 1(a), one side of the four sides of the quadrilateral shape and the first main surface in the neighborhood thereof are not covered by the first transparent plate electrode 20. In the transparent piezoelectric films 10 of FIGS. 1(b) and 1(c), two sides of the four sides of the quadrilateral shape and the first main surface in the neighborhoods thereof are not covered by the first transparent plate electrode 20. In the transparent piezoelectric film 10 of FIG. 1(d), three sides of the four sides of the quadrilateral shape and the first main surface in the neighborhoods thereof are not covered by the first transparent plate electrode 20.

From the standpoint of productivity, it is preferred that one to three sides of the four sides of the quadrilateral shape of the transparent piezoelectric film 10 and the first main surface in the neighborhood(s) thereof not be covered by the first transparent plate electrode 20, or in other words that one to three sides of the four sides of the quadrilateral shape of the transparent piezoelectric film 10 and the first main surface in the neighborhood(s) thereof be covered by the first transparent plate electrode 20.

It is preferred that an area of a region of overlap between the first transparent plate electrode and a second transparent plate electrode or a third transparent plate electrode be equal to or greater than 70% with respect to the area of the main surfaces of the transparent piezoelectric film.

The transparent piezoelectric film 10 is not particularly limited as long as it includes an organic polymer and is piezoelectric and transparent. Examples of the organic polymer include vinylidene fluoride-tetrafluoroethylene copolymer, vinylidene fluoride-trifluomethylene copolymer, and polyvinylidene fluoride. Particularly preferred examples of the transparent piezoelectric film 10 include films formed from a polymer such as vinylidene fluoride-tetrafluoroethylene copolymer, vinylidene fluoride-trifluoroethylene copolymer, and polyvinylidene fluoride.

Preferred among these is a film formed from vinylidene fluoride-tetrafluoroethylene copolymer.

The ratio (mole ratio) between vinylidene fluoride and tetrafluomethylene in the vinylidene fluoride-tetrafluoroethylene copolymer is preferably 50:50 to 90:10 and more preferably 65:35 to 80:20 from the standpoint of piezoelectricity related to touch pressure detection sensitivity.

The film formed from vinylidene fluoride-tetrafluoroethylene copolymer, the film formed from vinylidene fluoride-trifluoroethylene copolymer, and the film formed from polyvinylidene fluoride may be films that have been subjected to a stretching treatment from the standpoint of improving piezoelectricity.

The transparent piezoelectric film 10 may include additives added to resin films to the extent that they do not harm its piezoelectricity and transparency.

The thickness of the transparent piezoelectric film 10 is ordinarily 1 μm to 200 μm, is preferably equal to or less than 50 μm from the standpoint of transparency, and is preferably 20 μm to 100 μm from the standpoint of touch pressure detection sensitivity.

The transparent piezoelectric film 10 may be a single film or may comprise plural films.

It suffices for the first transparent plate electrode 20 to be transparent. As the first transparent plate electrode 20, for example, an electrode selected from inorganic electrodes, such as ITO (indium tin oxide) and tin oxide, and conducting polymers, such as thiophene conducting polymers, polyaniline, and polypyrrole, can be used.

Next, a method of manufacturing the transparent piezoelectric sheet of the present embodiment will be described.

The transparent piezoelectric sheet of the present embodiment can be manufactured, for example, by a manufacturing method 1 including the following steps.

<Manufacturing Method 1>

(1) A step of preparing the transparent piezoelectric film 10 that includes the organic polymer and whose entire main surfaces are piezoelectric (2) A step of layering the first transparent plate electrode 20 on part of the first main surface of the transparent piezoelectric film 10

In step (1), a transparent film is formed by a conventional method from the polymers described above. The film may also be acquired as a commercial product.

The film may be optionally subjected to a stretching treatment from the standpoint of improving piezoelectricity. Here, for the stretching, threefold to tenfold stretching in one axial direction is preferred. The stretching treatment may be performed by a conventional method.

The method of imparting piezoelectricity to the film differs depending also on the polymer configuring the film, but it suffices to perform a polarization treatment (also called a poling treatment) in order to impart piezoelectricity to the film formed from vinylidene fluoride-tetrafluoroethylene copolymer, vinylidene fluoride-trifluoroethylene copolymer, or polyvinylidene fluoride.

The polarization treatment can be performed by a corona discharge treatment or a conventional method. For example, the film may be sandwiched from both sides by metal electrodes or the like, and a 30 to 400 MV/m DC electric field may be applied for 0.1 second to 60 minutes.

In step (2), the first transparent plate electrode 20 is layered on part of the first main surface of the transparent piezoelectric film 10. The first transparent plate electrode 20 can, for example, be layered by being formed by sputtering or deposition on the surface of the transparent piezoelectric film 10.

Here, the first transparent plate electrode 20 is layered in such a way that the optional one to three sides of the four sides of the quadrilateral shape of the transparent piezoelectric film 10 and the first main surface in the neighborhood(s) thereof are not covered by the first transparent plate electrode 20.

For the transparent piezoelectric film 10, it is alright to use a transparent piezoelectric film of the size of the transparent piezoelectric sheet that is the end product, but from the standpoint of lowering the manufacturing cost it is also alright to use a long transparent piezoelectric film (that is, corresponding to the continuum in a one-dimensional direction or a two-dimensional direction of the transparent piezoelectric film 10), layer numerous electrodes on the long transparent piezoelectric film, and cut the long transparent piezoelectric film after step (2). In this case, it is preferred that the end product be designed in such a way that the side covered by the first transparent plate electrode 20 becomes a cutting line. According to this method, the transparent piezoelectric sheet of the present embodiment can be Obtained at a tow manufacturing cost.

Next, the use of the transparent piezoelectric sheet of the present embodiment will be described.

Figure 2A:
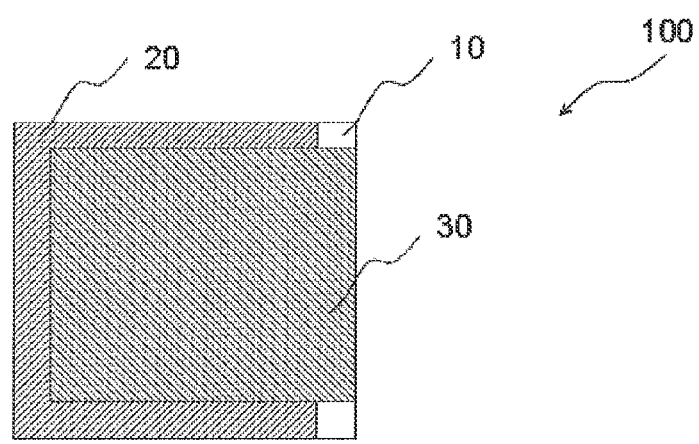
FIG. 2(a) is a plan view showing the configuration of an aspect of the transparent piezoelectric sheet of the present invention.

The transparent piezoelectric sheet 100 is installed and used on the upper surface of a device having a second transparent plate electrode 30 installed on all or part its upper surface in such a way that, as shown in FIG. 2, as seen in a plan view, the outline of the first transparent plate electrode 20 and the outline of the second transparent plate electrode 30 intersect each other and, as seen in a plan view, a region of overlap between the first transparent plate electrode and the second transparent plate electrode does not exist on the four sides of the quadrilateral shape of the transparent piezoelectric film and the neighborhoods thereof. FIG. 2(a) is a plan view seen from a back surface side of the second transparent plate electrode 30.

Figure 2B:
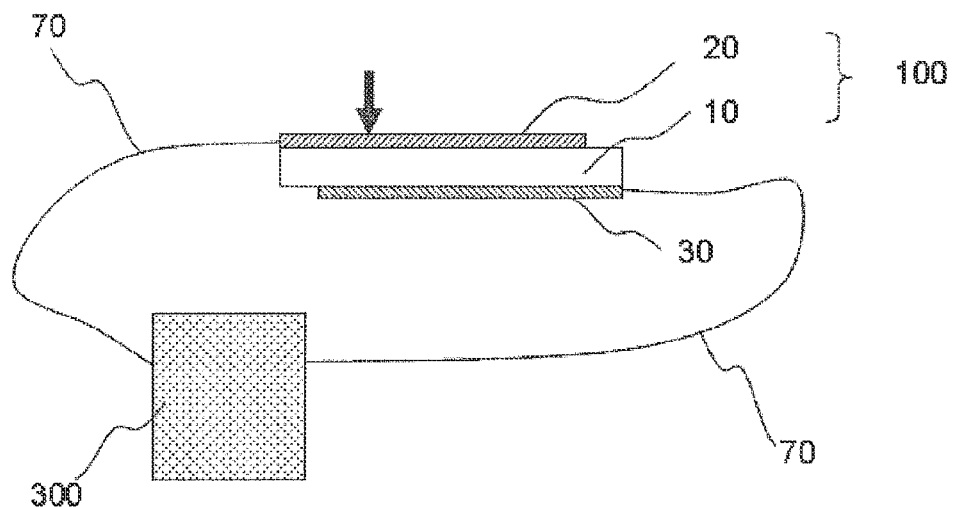
FIG. 2(b) is a sectional side view describing its mode of use.

An electrical signal produced by pressing, as indicated by the arrow in FIG. 2(b), the region of overlap between the first transparent plate electrode 20 and the second transparent plate electrode 30 travels through electrical wires 70 to a detection circuit 300, and the pressing (touch pressure) is detected.

Here, the transparent piezoelectric sheet 100 can be suitably used in combination with a touch position detection-use touch panel.

As the touch position detection-use touch panel, a conventionally used touch position detection-use touch panel with an arbitrary format such as a resistive touch panel, a capacitive touch panel, a surface acoustic wave touch panel, and an optical touch panel can be used.

The transparent piezoelectric sheet 100 is flexible, so even in a case where the position detection-use touch panel is positioned on the opposite side of the touch side of the transparent piezoelectric sheet 100, the position detection-use touch panel receives the pressure of the touch at the same time as the transparent piezoelectric sheet 100 and can therefore detect the touch position.

<Second Embodiment(Transparent Piezoelectric Sheet)>

First, the configuration of a transparent piezoelectric sheet of the present embodiment will be described.

A transparent piezoelectric sheet 101 of the present embodiment comprises: a quadrilateral-shaped transparent piezoelectric film 10 that includes an organic polymer and whose entire main surfaces are piezoelectric; and a first transparent plate electrode 20 that is layered on part of a first main surface of the transparent piezoelectric film 10, wherein one to three sides of the four sides of the quadrilateral shape of the transparent piezoelectric film 10 and the first main surface in the neighborhood(s) thereof are not covered by the first transparent plate electrode 20, the transparent piezoelectric sheet further comprises a third transparent plate electrode 31 that is layered on a second main surface of the transparent piezoelectric film 10, one to three sides of the four sides of the quadrilateral shape of the transparent piezoelectric film 10 and the second main surface in the neighborhood(s) thereof are not covered by the third transparent plate electrode 31, as seen in a plan view the outline of the first transparent plate electrode 20 and the outline of the third transparent plate electrode 31 intersect each other, and as seen in a plan view a region of overlap between the first transparent plate electrode 20 and the third transparent plate electrode 31 does not exist on the four sides of the quadrilateral shape of the transparent piezoelectric film 10 and the neighborhoods thereof.

The transparent piezoelectric sheet of the present embodiment will be described with reference to FIG. 3. The arrow in the drawing indicates a touch direction.

As shown in FIG. 3, the transparent piezoelectric sheet 101 of the present embodiment is configured from the one transparent piezoelectric film 10, the one first transparent plate electrode 20, and the one third transparent plate electrode 31.

Here, the transparent piezoelectric film 10 and the first transparent plate electrode 20 express the same meanings as those described in the first embodiment.

One to three sides of the four sides of the quadrilateral shape of the transparent piezoelectric film 10 and the second main surface in the neighborhood(s) thereof are not covered by the third transparent plate electrode 31.

Examples of specific aspects thereof are the same as those of the first a transparent plate electrode 20 shown in FIGS. 1(a) to 1(d).

One to three sides of the four sides of the quadrilateral shape of the transparent piezoelectric film 10 and the second main surface in the neighborhood(s) thereof are not covered by the third transparent plate electrode 31, or in other words one to three sides of the four sides of the quadrilateral shape of the transparent piezoelectric film 10 and the second main surface in the neighborhood(s) thereof are covered by the third transparent plate electrode 31, so it becomes possible to raise productivity as described below.

As the third transparent plate electrode 31, an electrode that is the same as the first transparent plate electrode 20 can be used.

As seen in a plan view, the outline of the first transparent plate electrode 20 and the outline of the third transparent plate electrode 31 intersect each other. That is, the outline of the first transparent plate electrode 20 and the outline of the third transparent plate electrode 31 do not have a relationship in which one encompasses the other.

As seen in a plan view, a region of overlap between the first transparent plate electrode 20 and the third transparent plate electrode 31 does not exist on the four sides of the quadrilateral shape of the transparent piezoelectric film 10 and the neighborhoods thereof.

This specifically can be realized by placing the third transparent plate electrode 31 in such a way that, as shown in FIG. 3, it does not cover the section(s) of the second main surface corresponding to the side(s) and neighborhood(s) of the first main surface covered by the first transparent plate electrode 20.

By placing the third transparent plate electrode 31 in this way, the four sides of the transparent piezoelectric film 10 and the neighborhoods thereof are not all covered by a transparent plate electrode (the first transparent plate electrode 20 or the third transparent plate electrode 31) on at least one of the first main surface and the second main surface.

Next, a method of manufacturing the transparent piezoelectric sheet of the present embodiment will be described.

The transparent piezoelectric sheet of the present embodiment can be manufactured, for example, by a manufacturing method 2 including the following steps.

>Manufacturing Method 2>

(1) A step of preparing the transparent piezoelectric film 10 that includes the organic polymer and whose entire main surfaces are piezoelectric (2) A step of layering the first transparent plate electrode 20 on part of the first main surface of the transparent piezoelectric film 10

(3) A step of layering the third transparent plate electrode 31 on part of the second main surface of the transparent piezoelectric film 10

Step (1) and step (2) can be implemented in the same way as step (1) and step (2) in manufacturing method 1.

Here, like in manufacturing method 1, for the transparent piezoelectric film 10, it is alright to use a transparent piezoelectric film of the size of the transparent piezoelectric sheet that is the end product, but it is also alright to use a long transparent piezoelectric film and cut the long transparent piezoelectric film to an appropriate size before step (2) or layer numerous electrodes on the long transparent piezoelectric film and cut the long transparent piezoelectric film after step (2). Moreover, as another method, it is also alright to cut the long transparent piezoelectric film after step (3).

Further, step (3) can be implemented in the same way as step (2) with the exception of placing the third transparent plate electrode 31 in the way described above.

That is, the third transparent plate electrode 31 is layered in such a way that the optional one to three sides of the four sides of the quadrilateral shape of the transparent piezoelectric film 10 and the second main surface in the neighborhood(s) thereof are not covered by the third transparent plate electrode 31 and in such a way that the third transparent plate electrode 31 does not cover the section(s) of the second main surface corresponding to the side(s) and neighborhood(s) of the first main surface covered by the first transparent plate electrode 20.

Figure 3A:
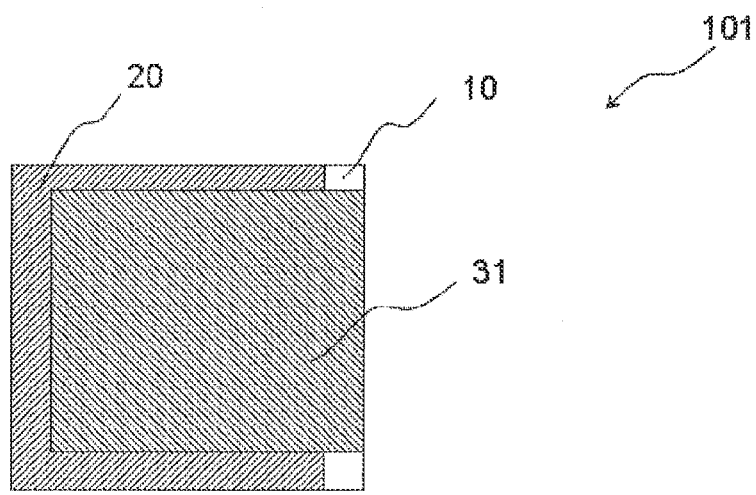
FIG. 3(a) is a plan view showing the configuration of an aspect of the transparent piezoelectric sheet of the present invention.
Figure 4:
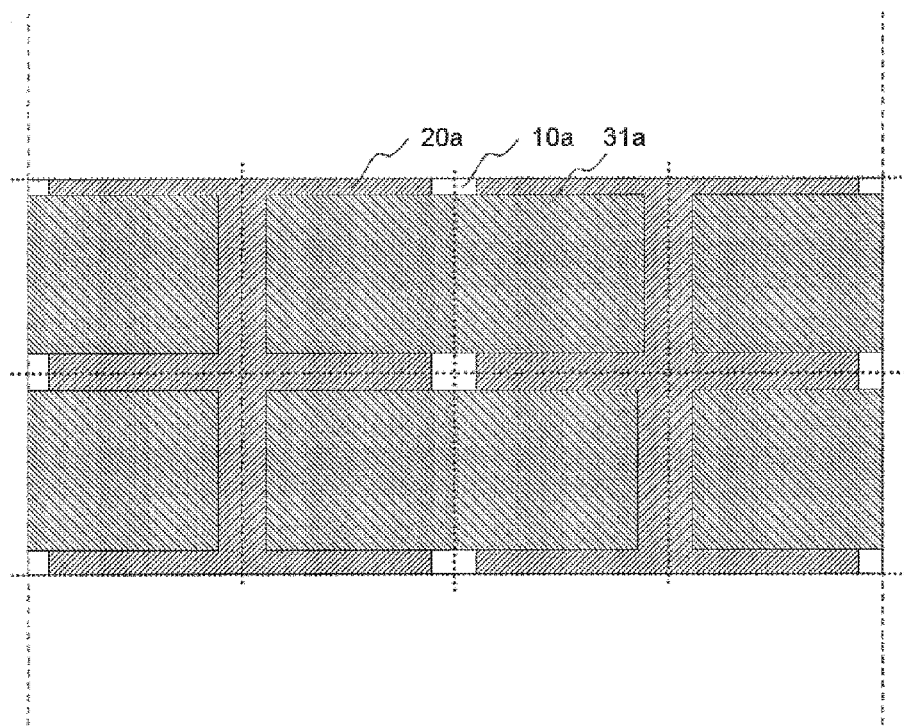
FIG. 4 is a plan view describing a method of manufacturing the transparent piezoelectric sheet of the present invention.

For the transparent piezoelectric film 10, it is alright to use a transparent piezoelectric film of the size of the transparent piezoelectric sheet that is the end product, but from the standpoint of lowering the manufacturing cost it is also alright to use a long transparent piezoelectric film 10a (that is, corresponding to the continuum in a one-dimensional direction or a two-dimensional direction of the transparent piezoelectric film 10), layer numerous electrodes on the long transparent piezoelectric film, and cut the long transparent piezoelectric film after step (2). In this case, as shown in FIG. 4, it is preferred that the end product be designed in such a way that the sides covered by the first transparent plate electrode 20 and the third transparent plate electrode 31 become cutting lines so that first transparent plate electrodes 20a and third transparent plate electrodes 31a are placed. According to this method, the transparent piezoelectric sheet of the present embodiment can be obtained at a low manufacturing cost. The dashed lines in FIG. 4 represent outlines of a long transparent piezoelectric film 10a. Here, the first transparent plate electrodes 20a and the third transparent plate electrodes 31a exist repeatedly in the same way in both the up direction and the down direction, but illustration of this is omitted in FIG. 4. By cutting at the dotted lines in FIG. 4, the transparent piezoelectric films 10, the first transparent plate electrodes 20, and the third transparent plate electrodes 31 arise from the transparent piezoelectric 10a, the first transparent plate electrodes 20a, and the third transparent plate electrodes 31a, respectively. Because of this, eight of the transparent piezoelectric sheets shown in FIG. 3(a) are obtained from the section actually shown in FIG. 4.

Next, the use of the transparent piezoelectric sheet of the present embodiment will be described.

Figure 3B:
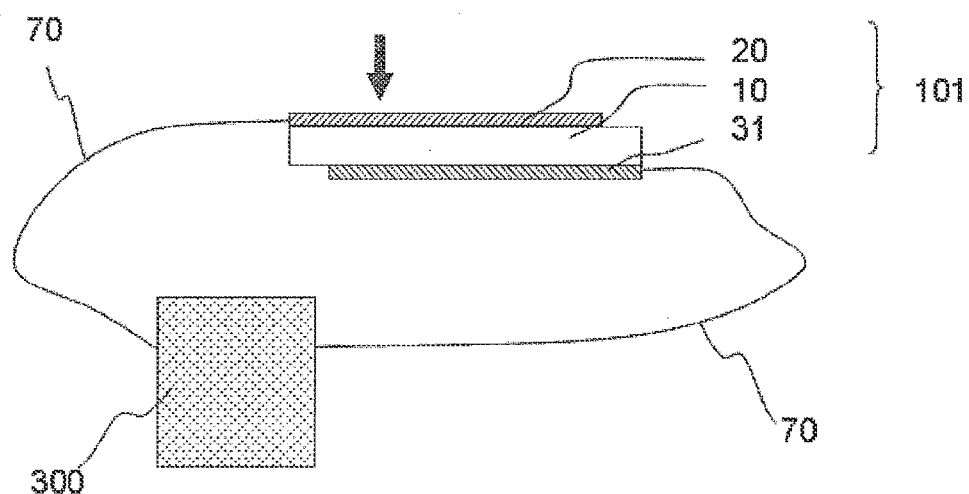
FIG. 3(b) is a sectional side view describing its mode of use.

An electrical signal produced by pressing, as indicated by the arrow in FIG. 3(b), the region of overlap between the first transparent plate electrode 20 and the third transparent plate electrode 31 travels through electrical wires 70 to a detection circuit 300, and the pressing (touch pressure) is detected.

Further, as described above, the four sides of the transparent piezoelectric film 10 and the neighborhoods are not all covered by a transparent plate electrode (the first transparent plate electrode 20 or the third transparent plate electrode 31) on at least one of the first main surface and the second main surface.

Consequently, by placing a frame in such a way that the frame covers only the four sides of the transparent piezoelectric film 10 and the neighborhoods thereof, it can be ensured that the frame does not coincide with the region of overlap between the first transparent plate electrode 20 and the third transparent plate electrode 31, so the transparent piezoelectric sheet of the present embodiment is capable of being accommodated in a frame and used without touch pressure detection being hindered by the pressure applied by the frame.

Here, the transparent piezoelectric sheet 101 can be suitably used in combination with a touch position detection-use touch panel.

The touch position detection-use touch panel is not particularly limited, and a conventionally used touch position detection-use touch panel with an arbitrary format such as a resistive touch panel, a capacitive touch panel, a surface acoustic wave touch panel, and an optical touch panel can be used.

The transparent piezoelectric sheet 101 is flexible, so even in a case where the position detection-use touch panel is positioned on the opposite side of the touch side of the transparent piezoelectric sheet 101, the position detection-use touch panel receives the pressure of the touch at the same time as the transparent piezoelectric sheet 101 and can therefore detect the touch position.

<Third Embodiment(Transparent Piezoelectric Sheet-with-a-Frame)>

First, the configuration of a transparent piezoelectric sheet-with-a-frame of the present embodiment will be described.

A transparent piezoelectric sheet-with-a-frame of the present embodiment comprises: a transparent piezoelectric sheet 101 that is equipped with a quadrilateral-shaped transparent piezoelectric film 10 that includes an organic polymer and whose entire main surfaces are piezoelectric, a first transparent plate electrode 20 that is layered on part of a first main surface of the transparent piezoelectric film, and a third transparent plate electrode 31 that is layered on part of a second main surface of the transparent piezoelectric film; and a frame 40 that covers a peripheral edge portion of the transparent piezoelectric film.

One to three sides of the four sides of the quadrilateral shape of the transparent piezoelectric film 10 and the first main surface in the neighborhood(s) thereof are not covered by the first transparent plate electrode 20, and one to three sides of the four sides of the quadrilateral shape of the transparent piezoelectric film and the second main surface in the neighborhood(s) thereof are not covered by the third transparent plate electrode 31.

Further, as seen in a plan view the outline of the first transparent plate electrode 20 and the outline of the third transparent plate electrode 31 intersect each other, as seen in a plan view a region of overlap between the first transparent plate electrode 20 and the third transparent plate electrode 31 does not exist on the four sides of the quadrilateral shape of the transparent piezoelectric film and the neighborhoods thereof and the frame covers the four sides of the quadrilateral shape of the transparent piezoelectric film.

The frame 40 does not coincide with the region of overlap as seen in a plan view.

The transparent piezoelectric sheet-with-a-frame of the present embodiment will be described with reference to FIG. 5. The arrow in the drawing indicates a touch direction.

Figure 5A:
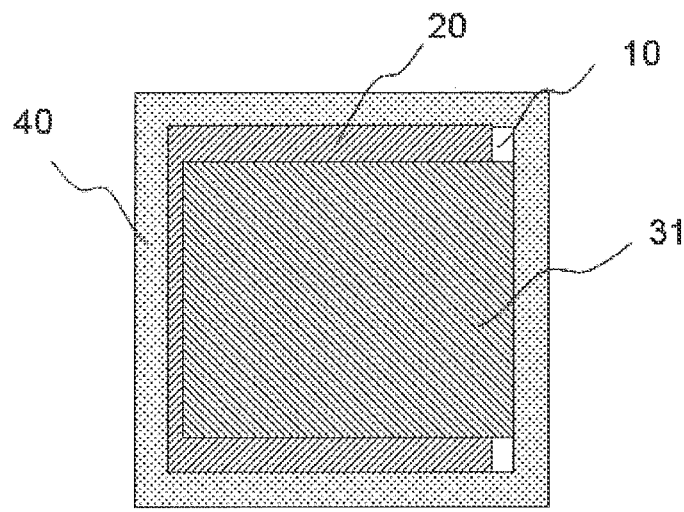
FIG. 5(a) is a plan view of an aspect of a transparent piezoelectric sheet-with-a-frame of the present invention.

As shown in FIG. 5, the transparent piezoelectric sheet-with-a-frame of the present embodiment is configured from the transparent piezoelectric film 10, the first transparent plate electrode 20, the third transparent plate electrode 31, and the frame 40.

Here, the transparent piezoelectric film 10, the first transparent plate electrode 20, and the third transparent plate electrode 31 express the same meanings as those described in the second embodiment.

That is, the transparent piezoelectric sheet-with-a-frame of the present embodiment corresponds to a configuration in which the transparent piezoelectric sheet 101 of the second embodiment is accommodated in the frame 40.

For the frame 40, a frame with a shape that does not coincide with the region of overlap between the first transparent plate electrode 20 and the third transparent plate electrode 31 is used in accordance with the configuration of the transparent piezoelectric sheet of the second embodiment.

The material of the frame 40 is not particularly limited, but a frame made of resin is preferred.

The frame 40 preferably has two holes for passing through two electrical wires 70 that connect the first transparent plate electrode 20 and the third transparent plate electrode 31 to a detection circuit 300. Alternatively, part of the frame may be configured by a conductive material such as metal, and the electrical wires 70 may be connected to that conductive section.

Next, the use of the transparent piezoelectric sheet-with-a-frame of the present embodiment will be described with reference to FIG. 5(b).

Figure 5B:
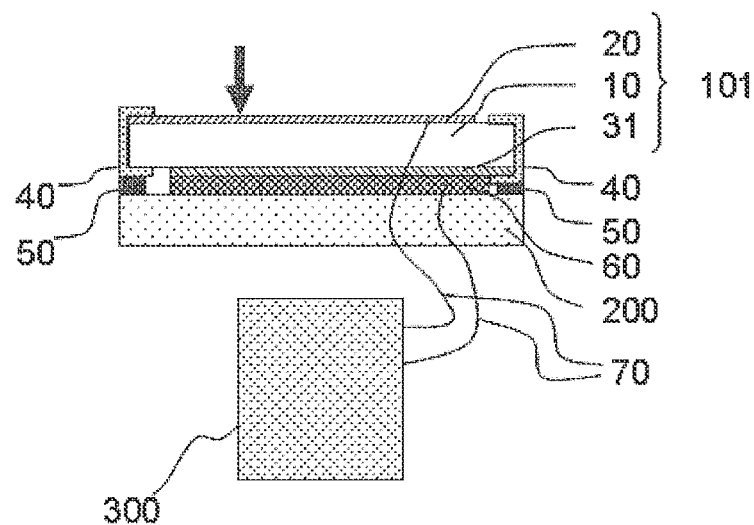
FIG. 5(b) is a sectional side view describing its mode of use.

In FIG. 5(b), a touch position detection-use touch panel 200 is placed on the surface on the opposite side of the touch surface of the transparent piezoelectric sheet 101. The touch position detection-use touch panel 200 is in contact with the transparent piezoelectric sheet 101 via an insulating layer 60.

The transparent piezoelectric sheet 101 can be adhered by a pressure-sensitive adhesive portion 50 to one surface of the touch position detection-use touch panel 200 and used.

An electrical signal produced by pressing, as indicated by the arrow in FIG. 5(b), the region of overlap between the first transparent plate electrode 20 and the third transparent plate electrode 31 travels through the electrical wires 70 to the detection circuit 300, and the pressing (touch pressure) is detected. The transparent piezoelectric sheet 101 is flexible, so the touch position detection-use touch panel 200 also receives the pressure of the touch at the same time via the insulating layer 60. Because of this, the touch position is also detected by the touch position detection-use touch panel 200.

Further, alternatively, the transparent piezoelectric sheet 101 can also be adhered by the pressure-sensitive adhesive portion 50 to a display surface of a display device and used.

The transparent piezoelectric sheet 101 can detect touch pressure, so the transparent piezoelectric sheet-with-a-frame of the present embodiment can be used for touch pressure detection.

<Fourth Embodiment(Touch Panel)>

First, the configuration of a touch panel of the present embodiment will be described.

The touch panel of the present embodiment comprises: a transparent piezoelectric sheet 101; a touch position detection-use touch panel 201 that is placed on one surface of the transparent piezoelectric sheet 101; and a frame 41 that covers a peripheral edge portion of the transparent piezoelectric sheet 101 and a peripheral edge portion of the touch position detection-use touch panel 201.

The transparent piezoelectric sheet 101 comprises: a quadrilateral-shaped transparent piezoelectric film 10 that includes an organic polymer and whose entire main surfaces are piezoelectric; a first transparent plate electrode 20 that is layered on part of a first main surface of the transparent piezoelectric film 10; and a third transparent plate electrode 31 that is layered on part of a second main surface of the transparent piezoelectric film 10, wherein one to three sides of the four sides of the quadrilateral shape of the transparent piezoelectric film 10 and the first main surface in the neighborhood(s) thereof are not covered by the first transparent plate electrode 20, one to three sides of the four sides of the quadrilateral shape of the transparent piezoelectric film 10 and the second main surface in the neighborhood(s) thereof are not covered by the third transparent plate electrode 31, as seen in a plan view the outline of the first transparent plate electrode 20 and the outline of the third transparent plate electrode 31 intersect each other, and as seen in a plan view a region of overlap between the first transparent plate electrode 20 and the third transparent plate electrode 31 does not exist on the four sides of the quadrilateral shape of the transparent piezoelectric film 10 and the neighborhoods thereof.

The touch panel of the present embodiment will be described with reference to FIG. 6. The arrow in the drawing indicates a touch direction.

Figure 6A:
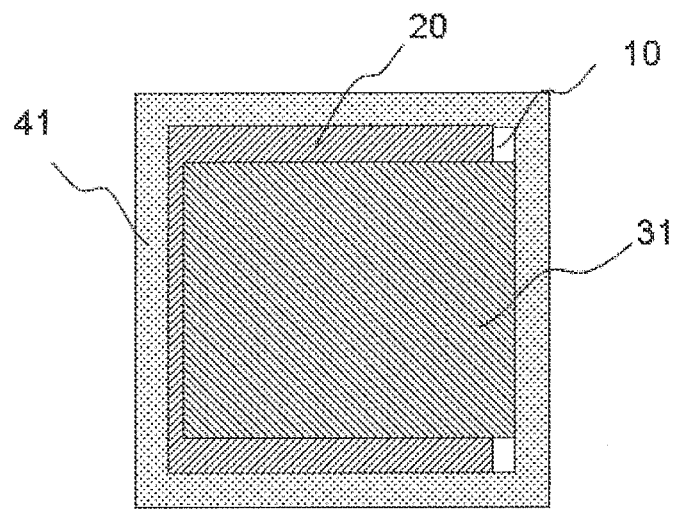
FIG. 6(a) is a plan view showing the configuration of an aspect of a touch panel of the present invention.
Figure 6B:
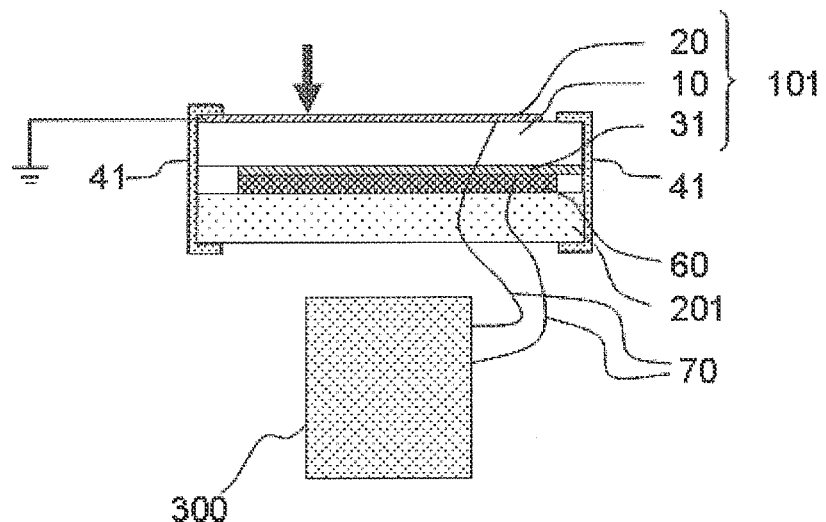
FIG. 6(b) is a sectional side view describing its mode of use.

As shown in FIG. 6, the touch panel of the present embodiment is equipped with the transparent piezoelectric sheet 101, the frame 41, an insulating layer 60, and the touch position detection-use touch panel 201. The transparent piezoelectric sheet 101 is equipped with the one transparent piezoelectric film 10, the one first transparent plate electrode 20, and the one third transparent plate electrode 31.

Here, the transparent piezoelectric film 10 and the first transparent plate electrode 20 express the same meanings as those described in the first to third embodiments.

FIG. 6(*a*) is a plan view seen from the side of the first transparent plate electrode 20.

In FIG. 6(*b*), the first transparent plate electrode 20 is placed on the surface on the touch side of the transparent piezoelectric sheet 101 and is aground electrode.

The touch position detection-use touch panel 201 is placed on the surface on the opposite side of the touch side of the transparent piezoelectric sheet 101 in such a way as to be in contact with the transparent piezoelectric sheet 101 via the insulating layer 60.

Here, the touch position detection-use touch panel 201 is not particularly limited, and a conventionally used touch position detection-use touch panel with an arbitrary format such as a resistive touch panel, a capacitive touch panel, a surface acoustic wave touch panel, and an optical touch panel can be used.

The transparent piezoelectric sheet 101 is flexible, so an electrical signal produced by pressing the transparent piezoelectric sheet 101 as indicated by the arrow in FIG. 6(*b*) travels through electrical wires 70 to a detection circuit 300, and the pressing (touch pressure) is detected. The transparent piezoelectric sheet 101 is flexible, so the touch position detection-use touch panel 201 also receives the pressure of the touch at the same time via the insulating layer 60. Because of this, the touch position is also detected by the touch position detection-use touch panel 201.

The frame 41 covers in a frame-like manner the peripheral edge portion of the transparent piezoelectric sheet 101 and the touch position detection-use touch panel 201. Although they are not shown in the drawings, holes through which the electrical wires 70 pass are disposed in the frame 41. Alternatively, part of the frame may be configured by a conductive material such as metal, and the electrical wires 70 may be connected to that conductive section.

Optionally, the front surface (particularly the front surface that is touched) of the first transparent plate electrode 20 and/or the third transparent plate electrode 31 may, in order to protect these, be covered by a protective layer such as a flexible resin sheet such as a polyethylene terephthalate sheet. The protective layer may double as an insulating layer.

The transparent piezoelectric sheet 101 can detect touch pressure, so the touch panel of the present embodiment can be used for touch pressure and touch position detection.

<Fifth Embodiment(Electronic Device)>

First, the configuration of an electronic device of e present embodiment will be described.

The electronic device of the present embodiment comprises: a transparent piezoelectric sheet 101 comprising a quadrilateral-shaped transparent piezoelectric film 10 that includes an organic polymer and whose entire surfaces are piezoelectric and a first transparent plate electrode 20 that is placed on part of a first main surface of the transparent piezoelectric film 10; and a casing 42 inside of which the transparent piezoelectric sheet is placed.

One to three sides of the four sides of the quadrilateral shape of the transparent piezoelectric film 10 and the first main surface in the neighborhood(s) thereof are not covered by the first transparent plate electrode 20, the electronic device further comprises a third transparent plate electrode 31 that is layered on part of a second main surface of the transparent piezoelectric film, one to three sides of the four sides of the quadrilateral shape of the transparent piezoelectric film 10 and the second main surface in the neighborhood(s) thereof are not covered by the third transparent plate electrode 31, as seen in a plan view the outline of the first transparent plate electrode 20 and the outline of the third transparent plate electrode 31 intersect each other, as seen in a plan view a region of overlap between the first transparent plate electrode 20 and the third transparent plate electrode 31 does not exist on the four sides of the quadrilateral shape of the transparent piezoelectric film and the neighborhoods thereof, and the casing covers the four sides of the quadrilateral shape of the transparent piezoelectric film.

The casing has an open portion 42*a*, an inner edge portion 42*b* that defines the open portion 42*a* covers in a frame-like manner and is in contact with the transparent piezoelectric sheet 101, and as seen in a plan view the region of that contact does not coincide with the region of overlap.

The electronic device of the present embodiment will be described with reference to FIG. 7. The arrow in the drawing indicates a touch direction.

Figure 7:
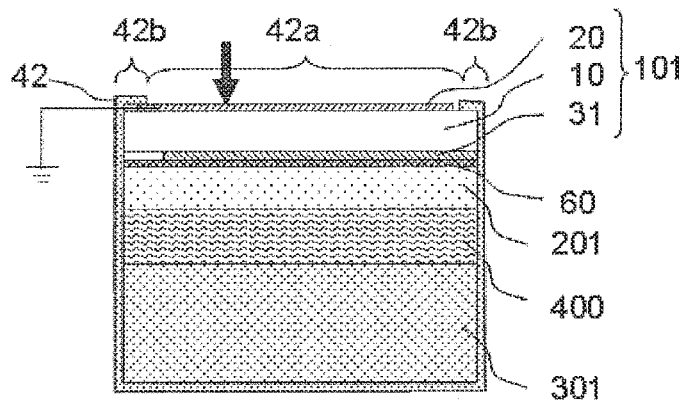
FIG. 7 is a sectional view showing the configuration of an aspect of an electronic device of the present invention.

As shown in FIG. 7, the electronic device of the present embodiment is configured from the transparent piezoelectric sheet 101, the casing 42, an insulating layer 60, a touch position detection-use touch panel 201, a display device 400, and a detection circuit 301. Although they are omitted in FIG. 7, the first transparent plate electrode 20 and the third transparent plate electrode 31 are each connected by electrical wires to the detection circuit 301.

The transparent piezoelectric sheet 101 comprises the one transparent piezoelectric film 10, the one first transparent plate electrode 20, and the one third transparent plate electrode 31.

The first transparent plate electrode 20 is placed on the first main surface of the transparent piezoelectric film 10.

Further, the third transparent plate electrode 31 is placed on the second main surface of the transparent piezoelectric film 10.

Here, the transparent piezoelectric film 10, the first transparent plate electrode 20, the third transparent plate electrode 31, the insulating layer 60, and the touch position detection-use touch panel 201 express the same meanings as those described in the fourth embodiment (touch panel). As shown in FIG. 7, the touch position detection-use touch panel 201 is placed on the surface on the opposite side of the touch side of the transparent piezoelectric sheet 101 in such a way as to be in contact with the transparent piezoelectric sheet 101 via the insulating layer 60.

That is, the electronic device of the present embodiment corresponds to a configuration in which the transparent piezoelectric sheet 101 and the touch position detection-use touch panel 201 in the fourth embodiment are used as members of an electronic device.

The first transparent plate electrode 20 is placed on the surface on the touch side of the transparent piezoelectric sheet 101 and is a ground electrode.

Optionally, the front surface (particularly the front surface that is touched) of the first transparent plate electrode 20 and/or the third transparent plate electrode 31 may, in order to protect these, be covered by a protective layer such as a flexible resin sheet such as a polyethylene terephthalate sheet. The protective layer may double as an insulating layer.

The casing 42 has the open portion 42a and the inner edge portion 42b that defines the open portion 42a.

An electrical signal produced by pressing, as indicated by the arrow in FIG. 7, the region of overlap between the first transparent plate electrode 20 and the third transparent plate electrode 31 in a predetermined position according to an image displayed by the display device 400 travels through the electrical wires to the detection circuit 301, and the pressing (touch pressure) is detected. And, because the transparent piezoelectric sheet 101 is flexible, the touch position detection-use touch panel 201 also receives the pressure of the touch at the same time via the insulating layer 60. Because of this, the touch position is also detected by the touch position detection-use touch panel 201, and on the basis of this the electronic device operates as preset. As is apparent from the above description, operation of the electronic device by touch is performed in the open portion 42a.

Examples of such electronic devices include mobile telephones, laptop computers, and computer monitors each having an operation portion equipped with a touch panel.

Figure 8:
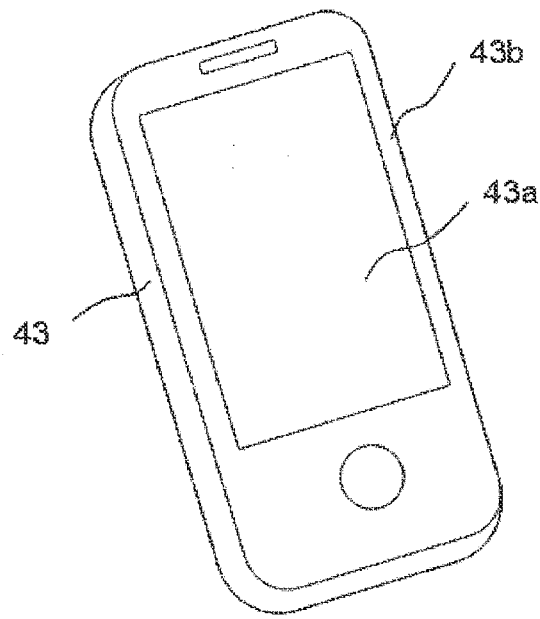
FIG. 8 is a perspective view showing t configuration of an aspect of the electronic device of the present invention.

FIG. 8 shows a schematic diagram in a case where the electronic device is a mobile telephone. The mobile telephone has a casing 43 that has an open portion 43a and an inner edge portion 43b that defines the open portion 43a. Although it is not shown, the transparent piezoelectric sheet 101 is placed in such a way as to be covered in a frame-like manner by the inner edge portion 43b.

The present invention has been described above, but the present invention is not intended to be limited only to the above embodiments and, it goes without saying, is capable of a variety of other modifications without departing from the gist thereof. Several of those modifications will be specifically described below.

>Modification 1>

A touch panel and an electronic device of the present modification will be described with reference to FIG. 9.

Figure 9:
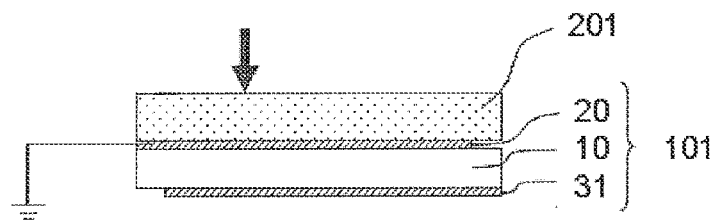
FIG. 9 is a sectional view describing sections of the touch panel and the electronic device of the present invention.

In the fourth embodiment (touch panel) and the fifth embodiment (electronic device), the touch position detection-use touch panel 201 is placed on the surface on the opposite side of the touch side of the transparent piezoelectric sheet 101, but as shown in FIG. 9, in modification 1, conversely from this the touch position detection-use touch panel 201 is placed on the surface on the touch side of the transparent piezoelectric sheet 101.

The touch position detection-use touch panel 201 is in directly contact with the transparent piezoelectric sheet 101.

The first transparent plate electrode 20 placed on the surface on the touch side of the transparent piezoelectric sheet 101 is a ground electrode and doubles as a ground electrode of the touch position detection-use touch panel 201. Because of this structural simplification, the touch panel and the electronic device of the present modification have low manufacturing costs.

FIG. 9, which describes the touch panel and the electronic device of the present modification, shows only the touch position detection-use touch panel 201 and the transparent piezoelectric sheet 101, but other sections are the same as those in the fourth embodiment (touch panel) and the fifth embodiment (electronic device).

The position of the touch indicated by the arrow in FIG. 9 is detected by the touch position detection-use touch panel 201, and the touch pressure is detected by the transparent piezoelectric sheet 101.

<Modification 2>

A touch panel and an electronic device of the present modification will be described with reference to FIG. 10.

Figure 10:
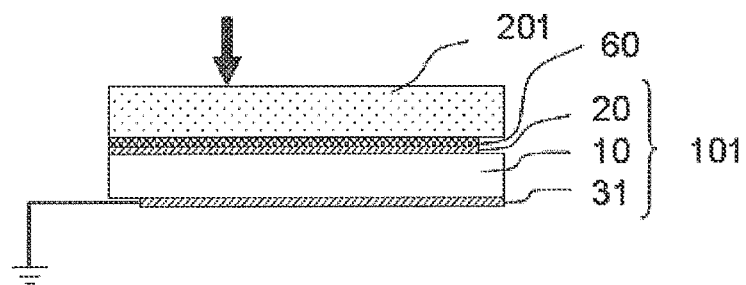
FIG. 10 is a sectional view describing sections of the touch panel and the electronic device of the present invention.

As shown in FIG. 10, like in modification 1, the touch position detection-use touch panel 201 is placed via an insulting layer 60 on the surface on the touch side of the transparent piezoelectric sheet 101.

The third transparent plate electrode 31 of the transparent piezoelectric sheet 101 is placed on the surface on the opposite side of the touch side and is a ground electrode. In this way, the ground electrode is placed on the surface on the opposite side of the touch side, so in the touch panel and the electronic device of the present modification, the noise of the output voltage is mitigated.

The position of the touch indicated by the arrow in FIG. 10 is detected by the touch position detection-use touch panel 201, and the touch pressure is detected by the transparent piezoelectric sheet 101.

<Modification 3>

A touch panel and an electronic device of the present modification will be described with reference to FIG. 11.

Figure 11:
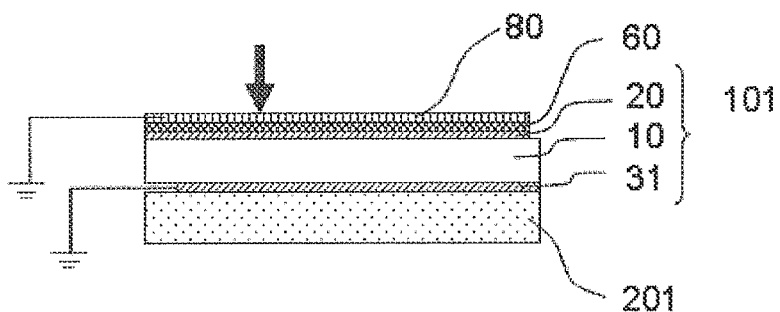
FIG. 11 is a sectional view describing sections of the touch panel and the electronic device of the present invention.

As shown in FIG. 11, the touch position detection-use touch panel 201 is placed on the surface on the opposite side of the touch side of the transparent piezoelectric sheet 101.

The third transparent plate electrode 31 of the transparent piezoelectric sheet 101 is placed on the opposite side of the touch side and is a ground electrode.

A ground electrode 80 is placed via an insulating layer 60 on the surface on the touch side of the transparent piezoelectric sheet 101.

In this way, ground electrodes are placed on both main surfaces of the transparent piezoelectric sheet 101, so in the touch panel and the electronic device of the present modification, the noise of the output voltage is particularly mitigated.

The pressure of the touch indicated by the arrow in FIG. 11 is detected by the transparent piezoelectric sheet 101, and the touch position is detected by the touch position detection-use touch panel 201.

INDUSTRIAL APPLICABILITY

The transparent piezoelectric sheet of the present invention can be used in touch panels and the like.

What is claimed is:

1. A transparent piezoelectric sheet comprising:
   a quadrilateral-shaped transparent piezoelectric film including an organic polymer, the quadrilateral-shaped transparent piezoelectric film having four sides and entire main surfaces that are piezoelectric;
   a first transparent plate electrode layered on part of a first main surface, which is one side surface of the main surfaces of the transparent piezoelectric film; and
   a second transparent plate electrode layered on part of a second main surface, which is an opposite side surface from the first main surfaces of the transparent piezoelectric film,
   the transparent piezoelectric film has a non-covered portion, which is a part of the first main surface, not covered by the first transparent plate electrode, the non-covered portion is one of
- a first part one side of the four sides of the quadrilateral shape the transparent piezoelectric film and the neighborhood thereof,
- a second part including two sides of the four sides of the quadrilateral shape of the transparent a piezoelectric film and the neighborhoods thereof and
- a third part including three sides of the four sides of the quadrilateral shape of the transparent piezoelectric film and the neighborhood thereof, at least a part of the second transparent plate electrode being overlapped with at least a part of the non-covered portion as seen in a an view, as seen in the plan view, an overlap region being equal to or greater than 70% of an area of the main surfaces of the transparent piezoelectric film, the overlap region which is an area of a region of overlap between the first transparent plate electrode and the second transparent plate electrode, and the transparent piezoelectric sheet being used in a state that
- at least a part of the non-covered portion is overlapped with at least a part of an edge portion of a frame in a thickness direction, and the frame holds all of the four sides of the transparent piezoelectric film in a thickness direction, or
- at least a part of the non-covered portion is overlapped with at least a part of an edge portion of a casing in a thickness direction, and the casing holds one side, two sides or three sides of the four sides of the transparent piezoelectric film in a thickness direction.

2. The transparent piezoelectric sheet according to claim 1, wherein
as seen in a plan view, an outline of the first transparent plate electrode and an outline of the second transparent plate electrode intersect each other and
as seen in a plan view, a region of overlap between the first transparent plate electrode and the second transparent plate electrode does not exist on all of the four sides of the quadrilateral shape of the transparent piezoelectric film and the neighborhoods thereof.

3. The transparent piezoelectric sheet according to claim 1, wherein
a thickness of the transparent piezoelectric film is 1 μm to 200 μm.

4. The transparent piezoelectric sheet according to claim 1, wherein
the organic polymer is selected from vinylidene fluoride-tetrafluoroethylene copolymer, vinylidene fluoride-trifluoroethylene copolymer, and polyvinylidene fluoride.

5. The transparent piezoelectric sheet according to claim 1, wherein
the side and the neighborhood thereof is a region within 1 mm to 30 mm from that side.

6. The transparent piezoelectric sheet according to claim 1, wherein
the transparent piezoelectric sheet is configured to detect touch pressure.

7. The transparent piezoelectric sheet according to claim 1, wherein
the transparent piezoelectric sheet is used in combination with a touch position detection-use touch panel.

8. The transparent piezoelectric sheet according to claim 7, wherein
the touch position detection-use touch panel is a resistive touch panel or a capacitive touch panel.

9. A transparent piezoelectric sheet-with-a-frame including the transparent piezoelectric sheet according to claim 1, the transparent piezoelectric sheet-with-a-frame further comprising:
the frame holding all of the four sides of the transparent piezoelectric film in a thickness direction,
as seen in a plan view, the frame not overlapping with the overlap region.

10. The transparent piezoelectric sheet-with-a-frame according to claim 9, further comprising
an adhesive portion disposed on a surface thereof.

11. A touch position detection-use combination device comprising:
the transparent piezoelectric sheet-with-a-frame according to claim 10; and
a touch position detection-use touch panel detecting a touch position without detecting a touch pressure,
the transparent piezoelectric sheet-with-a frame being adhered to the touch position detection-use touch panel by the adhesive portion.

12. A display combination device comprising:
the transparent piezoelectric sheet-with-a-frame according to claim 10; and
a display device having a display,
the transparent piezoelectric sheet-with a frame being adhered to the display of the display device by the adhesive portion.

13. A touch panel comprising:
the transparent piezoelectric sheet according to claim 1,
a touch position detection-use touch panel placed on one surface of the transparent piezoelectric sheet; and
the frame, the frame covering a peripheral edge portion of the transparent piezoelectric sheet and a peripheral edge portion of the touch position detection-use touch panel.

14. An electronic device comprising:
the transparent piezoelectric sheet according claim 1; and
the casing, the transparent piezoelectric sheet is disposed in the casing, the casing holding one side, two sides or three sides of the four sides of the transparent piezoelectric film in a thickness direction, and the casing having
an open portion,
an inner edge portion defining the open portion, the inner edge portion framing and contacting the transparent piezoelectric sheet, and
as seen in a plan view, a region of contact between the inner edge portion and the transparent piezoelectric sheet that does not overlap with the region of overlap between the first transparent plate electrode and the second transparent plate electrode.

15. The electronic device according to claim 14, further comprising
a touch position detection-use touch panel placed in contact with a surface on an opposite side of a touch side of the transparent piezoelectric sheet.

16. The transparent piezoelectric sheet according to claim 1, wherein
one of the first transparent plate electrode and the second transparent plate electrode on the opposite side of the touch side is a ground electrode.

17. The transparent piezoelectric sheet according in to claim 7, wherein
the one of the first transparent plate electrode and the second transparent plate electrode on the opposite side of the touch side doubles as a ground electrode of the touch position detection-use touch panel.

* * * * *